(12) United States Patent
Goldsby

(10) Patent No.: US 11,362,253 B1
(45) Date of Patent: Jun. 14, 2022

(54) THERMOELECTRIC MATERIAL

(71) Applicant: United States of America as represented by the Administrator of NASA, Washingon, DC (US)

(72) Inventor: Jon C. Goldsby, Avon, OH (US)

(*) Notice: Subject to any disclaimer, the term of this patent is extended or adjusted under 35 U.S.C. 154(b) by 74 days.

(21) Appl. No.: 16/144,241

(22) Filed: Sep. 27, 2018

Related U.S. Application Data

(60) Provisional application No. 62/565,608, filed on Sep. 29, 2017.

(51) Int. Cl.
  *H01L 35/22*   (2006.01)
  *H01L 35/32*   (2006.01)
  *C01G 55/00*   (2006.01)

(52) U.S. Cl.
  CPC ............ *H01L 35/22* (2013.01); *C01G 55/004* (2013.01); *H01L 35/32* (2013.01); *C01P 2002/36* (2013.01); *C01P 2002/72* (2013.01); *C01P 2006/32* (2013.01); *C01P 2006/40* (2013.01)

(58) Field of Classification Search
  None
  See application file for complete search history.

(56) References Cited

U.S. PATENT DOCUMENTS

| | | | | |
|---|---|---|---|---|
| 6,459,031 B1* | 10/2002 | Panaghe | ............... | H01L 35/225 136/236.1 |
| 8,133,463 B1* | 3/2012 | Berry | ............... | B01J 37/0236 423/418.2 |
| 2012/0260962 A1* | 10/2012 | Caroff | ............... | H01L 35/34 136/205 |
| 2020/0027955 A1* | 1/2020 | Kikuchi | ............... | H01L 29/22 |

OTHER PUBLICATIONS

M.A. Subramanian, G. Aravamudan, and G. V. Subba Rao, "Synthesis and electrical properties of Ln2(V4/3W2/3)O7 pyrochlores", Materials Research Bulletin 14(11), p. 1457-1461 (Year: 1979).*
M. A. Spears, H. L. Tuller, "Ruthenium doped gadolinium titanate: Effects of a variable valent acceptor on ionic and electronic conduction", MRS Online Proceedings Library 293, p. 301-306 (Year: 1992).*

* cited by examiner

*Primary Examiner* — Eric R Smith
(74) *Attorney, Agent, or Firm* — Robert H. Earp, III; Mark Wolfgang; Helen M. Galus

(57) ABSTRACT

An apparatus for solid state energy harvesting includes a complex oxide based pyrochlores having a chemical formula of A2 B2 O7 configured to directly convert heat into electricity and operate and function at a higher temperature without oxidizing in air. The complex oxide based pyrochlores are mixed with cation at B-site.

16 Claims, 11 Drawing Sheets

100

THERMOELECTRIC MATERIAL

CROSS REFERENCE TO RELATED APPLICATION

This application claims the benefit of U.S. Provisional Patent Application Ser. No. 62/565,608 filed on Sep. 29, 2017. The subject matter of this earlier-filed application is hereby incorporated by reference in its entirety.

ORIGIN OF THE INVENTION

The invention described herein was made in the performance of work under a NASA contract and is subject to the provisions of Section 305 of the National Aeronautics and Space Act, Public Law 111-314, § 3 (124 Stat. 3330, 51 U.S.C. Chapter 201).

FIELD

The present invention generally relates to thermoelectric material, and more particularly, to thermoelectric material configured to serve as a direct converter of heat into electricity.

BACKGROUND

There is a growing momentum in the automotive industry to harvest energy from exhaust using solid state power conversion processes. These processes can convert kilowatt levels of electrical power from a vehicle's engine. Solid state power conversion devices, such as thermoelectric, depend solely upon the temperature gradients for their operation.

Aeronautic gas turbine engines have temperature gradients as well, throughout due to enthalpy processes of combustions. This may offer the possibility of generating electrical power for use in a primary and/or secondary electric system in an aircraft.

However, currently available thermoelectric materials do not possess the environmental durability and performance levels necessary to realize any benefits. For example, currently available thermoelectric materials (e.g., silicon-based or germanium-based) tend to oxidize or become unstable in the air at higher temperatures, e.g., at 600 to 700 degrees Celsius or higher.

Thus, an alternative material capable of serving as a direct converter of heat into electric, as well as capable of functioning at higher temperatures without oxidizing, may be more beneficial.

SUMMARY

Certain embodiments of the present invention may provide solutions to the problems and needs in the art that have not yet been fully identified, appreciated, or solved by conventional thermoelectric material. For example, some embodiments pertain to complex oxide based pyrochlores that convert heat into electricity and operate and function at high temperatures without oxidizing in air.

In an embodiment, an apparatus for solid state energy harvesting includes a complex oxide based pyrochlores having a chemical formula of A2 B2 O7 configured to directly convert heat into electricity and operate and function at a higher temperature without oxidizing in air. The complex oxide based pyrochlores are mixed with cation at B-site.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Solid state energy harvesting using waste heat available in gas turbine engines offers potential for power generation to meet growing power needs of aircraft. Some embodiments incorporate the use of pyrochlores, which are crystal compounds, that have a chemical formula A2 B2 O7. These pyrochlores range from insulating to semi-conducting and are almost as good as metal.

In some embodiments, complex oxide based pyrochlores with mixed cation at B-site A2 (B3+, B~5)O7 may be used in a gas turbine engine. With gas turbine engines, the complex oxide based pyrochlore may directly convert heat into electricity and may operate and/or function at higher temperatures without oxidizing in air. This thermoelectric material may also be used without special coatings or inert packaging.

To be used with gas turbine engines and in order for pyrochlores to function as a thermal electric, the pyrochlore should include the following characteristics: (1) Seebeck coefficient at approximately 100 micro-Volt per degree temperature Kelvin, (2) electrical resistivity of approximately $10^{-2}$ Ohm*cm, (3) thermal conductivity of less than 10 W/m*K, (4) electronic band gap greater than zero, and (5) high temperature capability.

Figure 1:
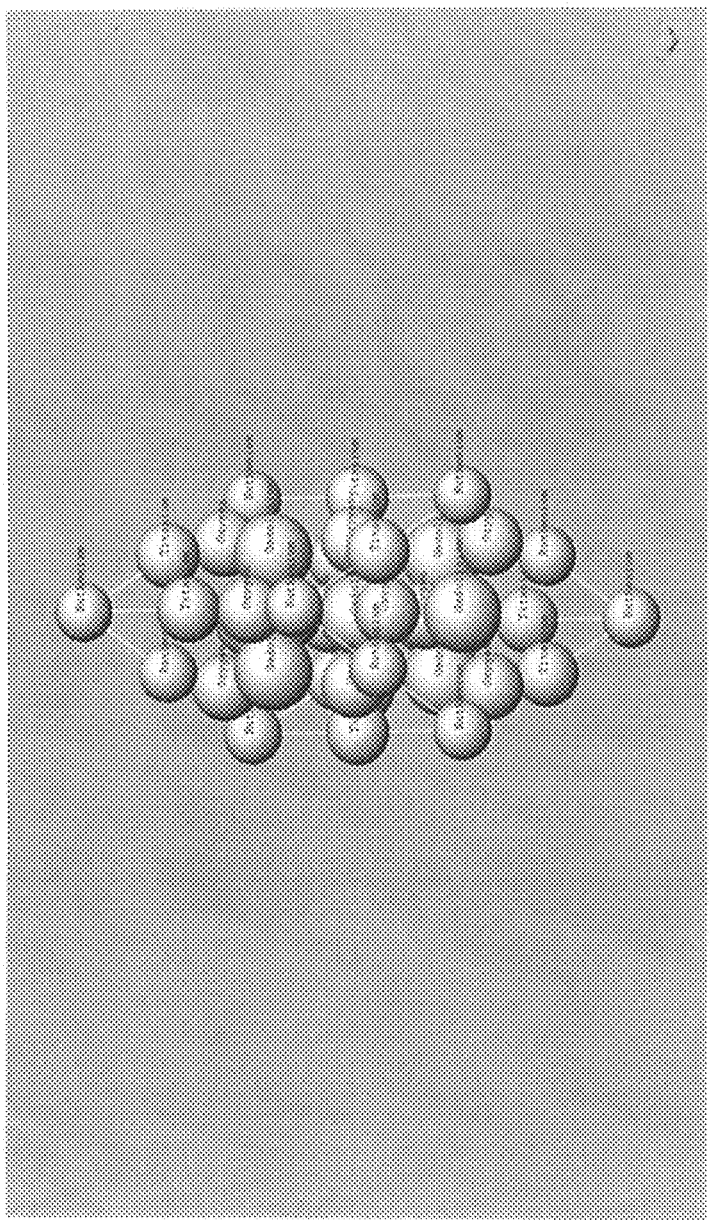
FIG. 1 is a diagram illustrating a complex oxide, according to an embodiment of the present invention.

FIG. 1 is a diagram illustrating a complex oxide (or thermoelectric material) 100, according to an embodiment of the present invention. In this embodiment, complex oxide 100 is composed of gadolinium ruthenium titanium tantalum oxide ($Gd_2RuTaO_7$). Also, in this embodiment, two cations are substituted at the B2 position. For example, the two cations in this embodiment are ruthenium and tantalum. Complex oxide 100 shown in FIG. 1 or primitive cell 202 of FIG. 2 is equivalent to that of a pyrochlore crystal structure.

Figure 2:
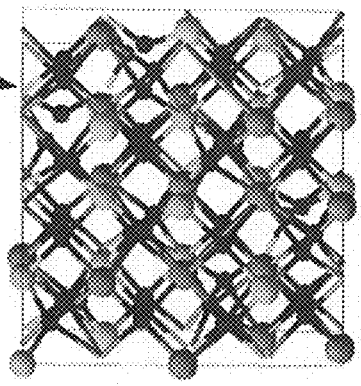
FIG. 2 are charts illustrating a predicted properties of calculated cell parameters, according to an embodiment of the present invention.

FIG. 2 are charts 200A-C illustrating predicted properties of calculated cell parameters, according to an embodiment of the present invention. Using the Schrodinger equation (see below) with approximations of V(x) based upon density functional theory.

$$\left[\frac{-\hbar^2}{2m}\frac{\partial^2}{\partial X^2}+V(X)\right]\psi(X) = E\psi(X) \quad \text{Equation (1)}$$

The predictive properties are shown in FIG. 2. For example, the predictive properties illustrate a lattice parameter, a density of 8.75 mg/cm³, etc. Density prediction may help guide fabrication to confirm compound identification.

Figure 3:
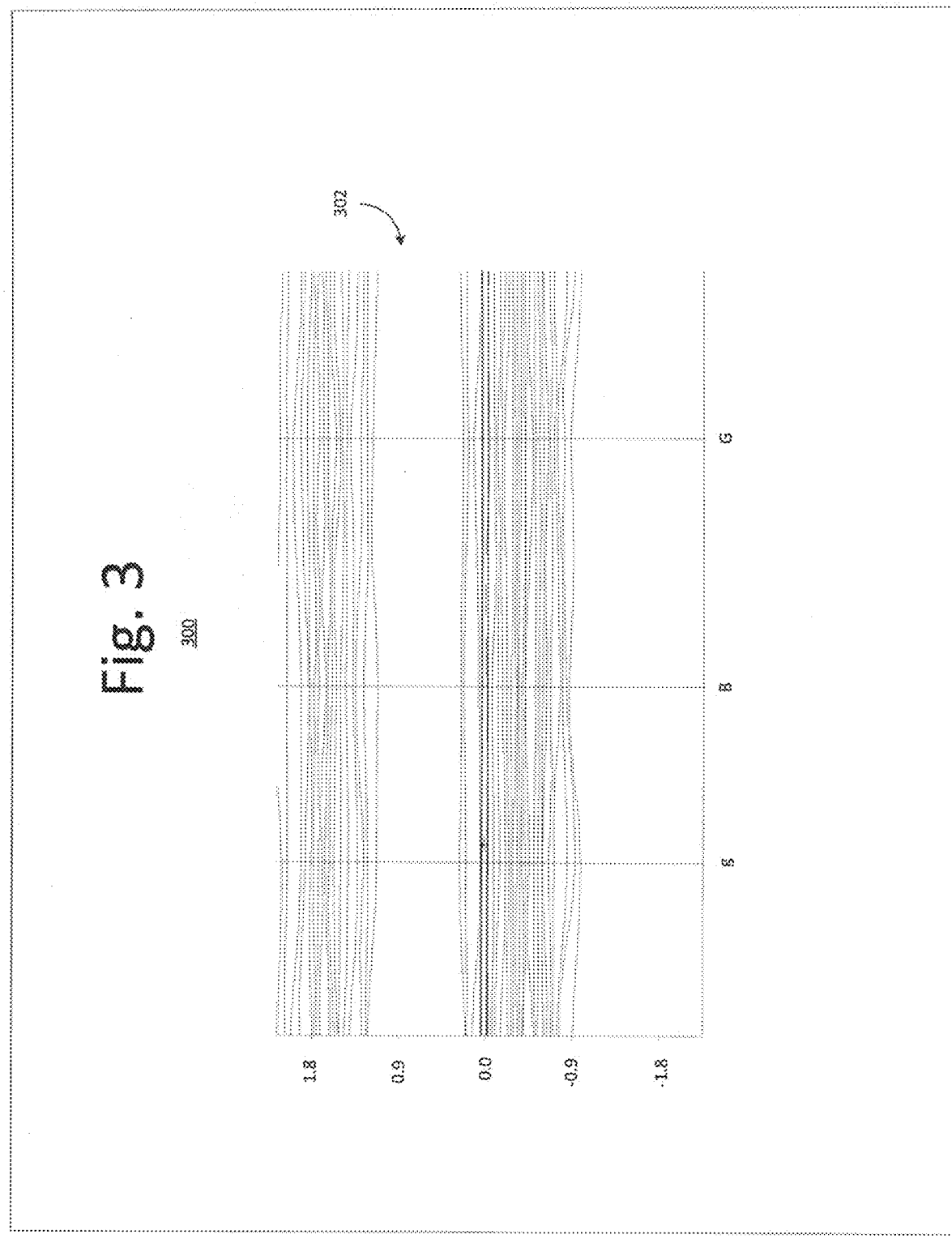
FIG. 3 is a graph illustrating a calculated electronic band structure, according to an embodiment of the present invention.

FIG. 3 is a graph 300 illustrating a calculated electronic band structure, according to an embodiment of the present invention. In this embodiment, graph 300 shows a small band gap 302. This small band gap 302 indicates that there is semiconducting behavior with a fraction of an electron volt. The semiconductors may be best served for electric power conversion.

Figure 4:
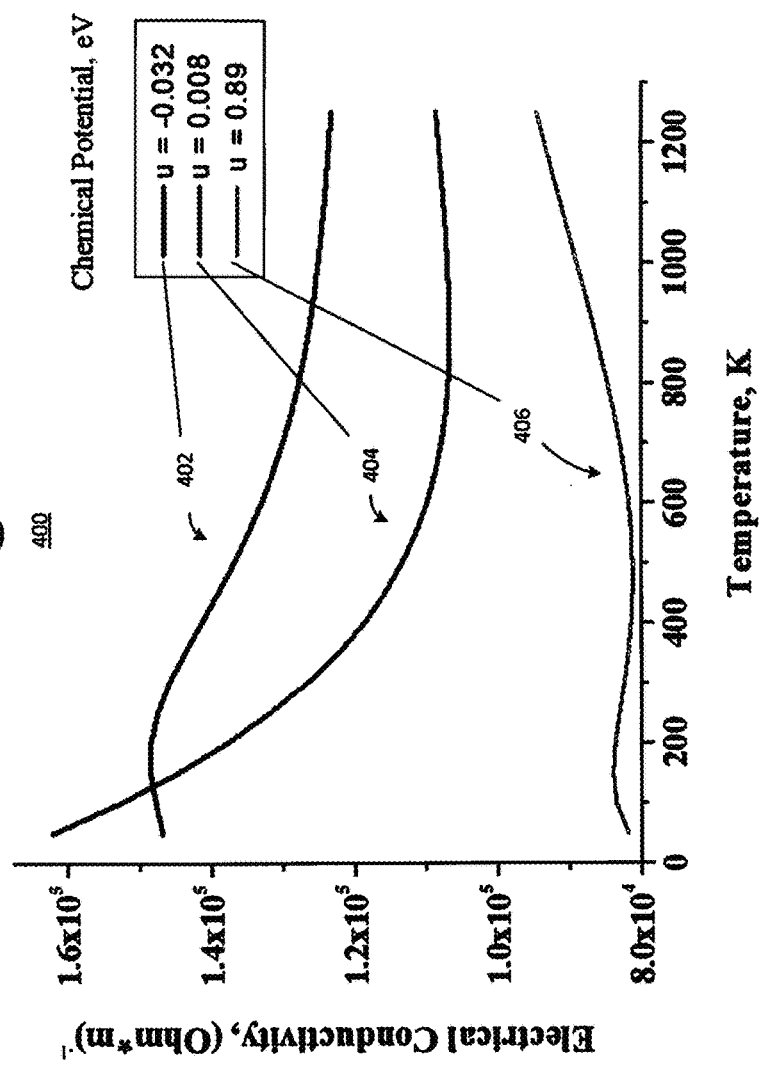
FIG. 4 is a graph illustrating electrical conductivity of the complex oxide, according to an embodiment of the present invention.

FIG. 4 is a graph 400 illustrating electrical conductivity of the complex oxide, according to an embodiment of the present invention. In graph 400, electrochemical potentials 402, 404, and 406 are reminiscent of dopants. In other words, graph 400 shows that the complex oxide has a reasonable chance of success at the temperature range of interest.

Figure 5:
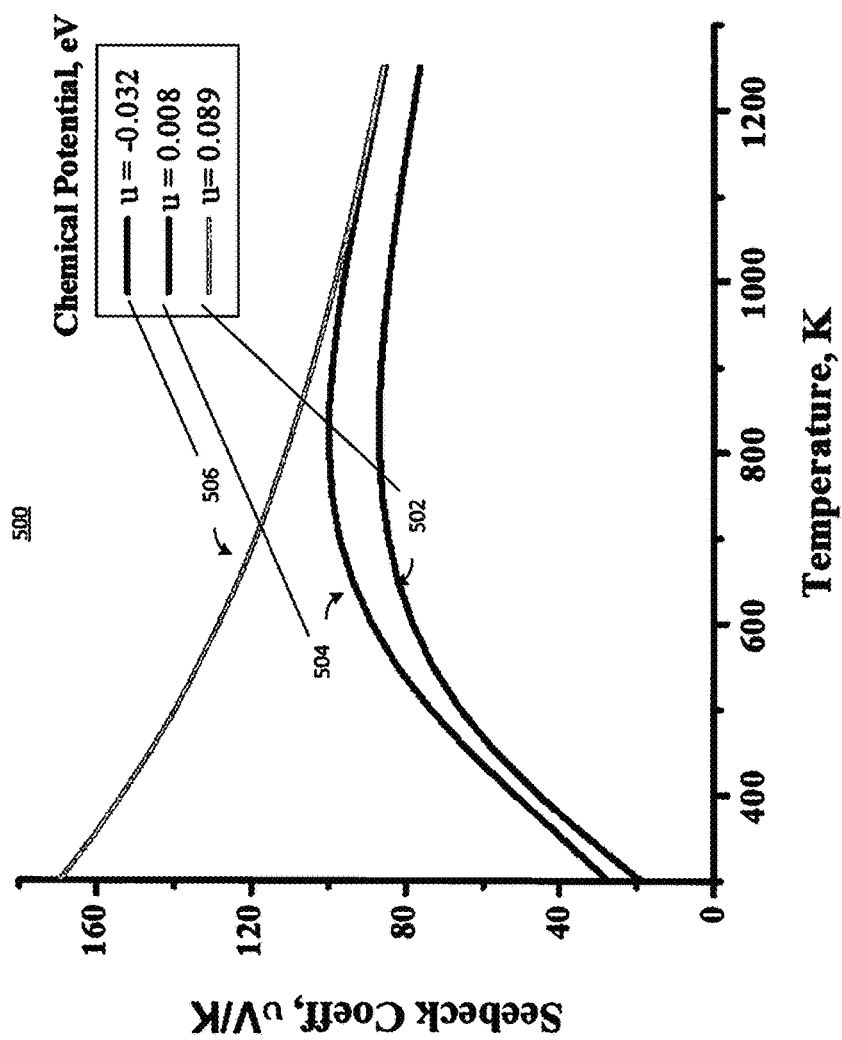
FIG. 5 is a graph illustrating temperature dependent Seebeck coefficient, according to an embodiment of the present invention.

FIG. 5 is a graph 500 illustrating temperature dependent Seebeck coefficient, according to an embodiment of the present invention. Specifically, graph 500 shows that the chemical potential shown in lines 502, 504, 506 should be realized at 80 microvolts around temperatures of 600 to 800 K.

Figure 6:
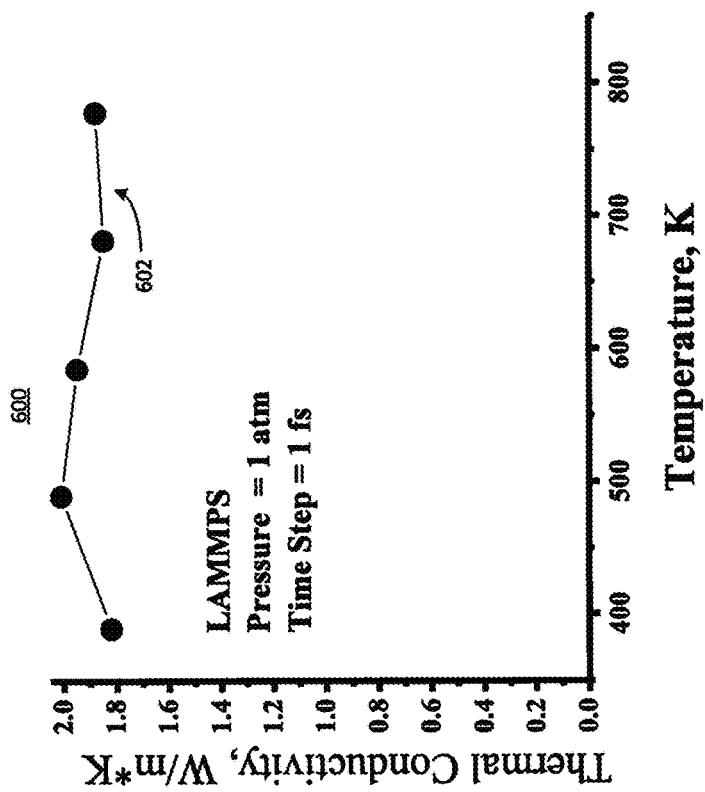
FIG. 6 is a graph illustrating molecular dynamic computation results, according to an embodiment of the present invention.

FIG. 6 is a graph 600 illustrating molecular dynamic computation results, according to an embodiment of the present invention. It should be noted that the complex oxide should be able to hold a thermal gradient, i.e., should have a fairly reasonable thermal conductivity. With this in mind, line 602 shows that the thermal conductivity is stable at or around 500 to 800 K.

Figure 7:
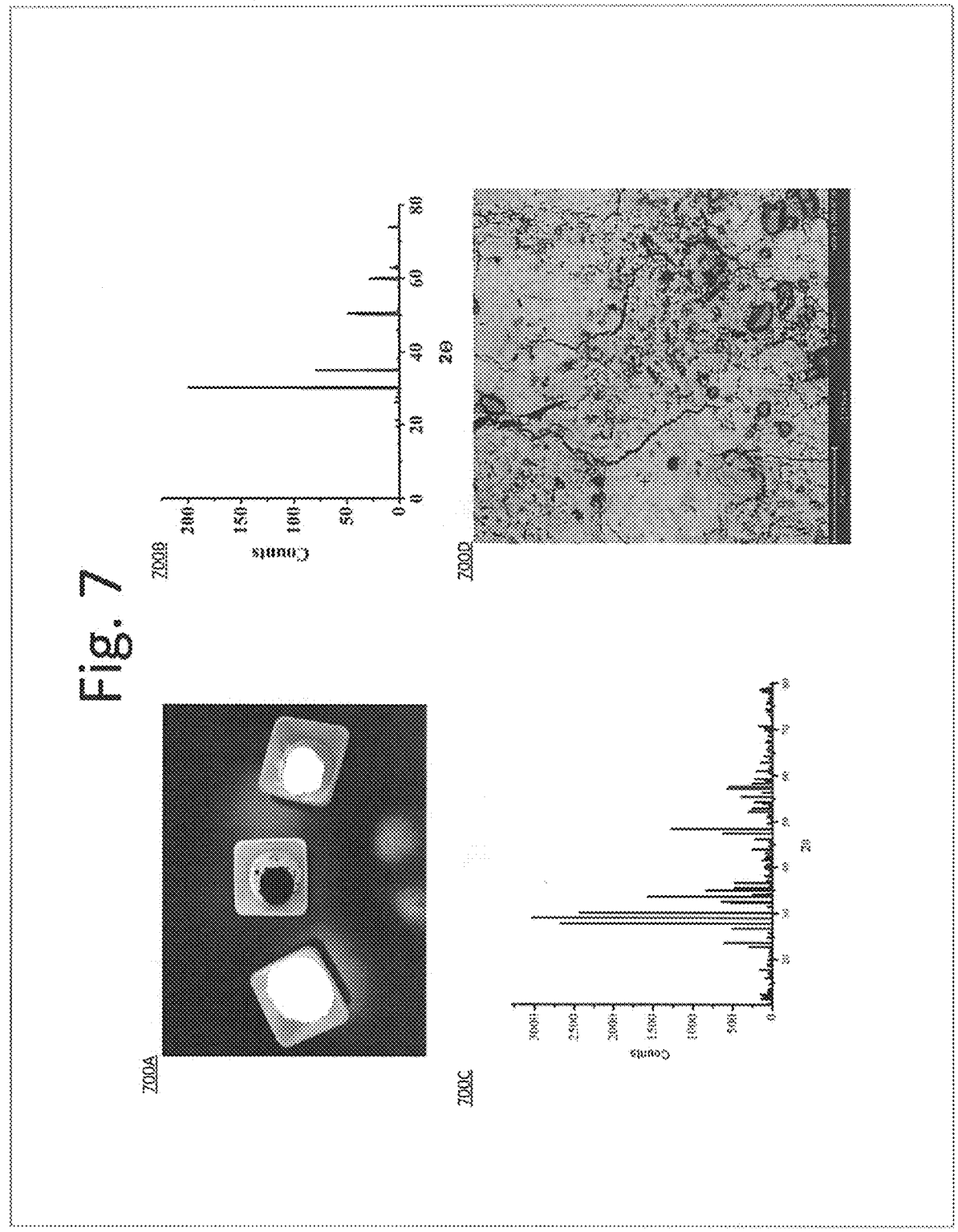
FIG. 7 illustrate images and graphs of a complex oxide that is synthesized, according to an embodiment of the present invention.

FIG. 7 illustrate images 700A, 700D and graphs 700B, 700C of a complex oxide that is synthesized, according to an embodiment of the present invention. Image 700A shows the first attempt to synthesize the complex oxide using the following chemical formula $2Gd_2O_3+Ta_2O_5+2RuO_2$. In this case, chemical powders were mixed and heated to see the outcome. With this mixture, the chemical did not result in a pure substance. For example, the graph 700B shows the predicted x-ray with respect to a pure sample. Looking at graph 700C, the x-ray from the chemical that was mixed and heated has extra peaks. These extra peaks indicate that a pure substance or sample was not formed. Graph 700D shows scanning electron microscope of a result compound from image 800A, which illustrates a product mixed with unreacted constituents.

Figure 8:
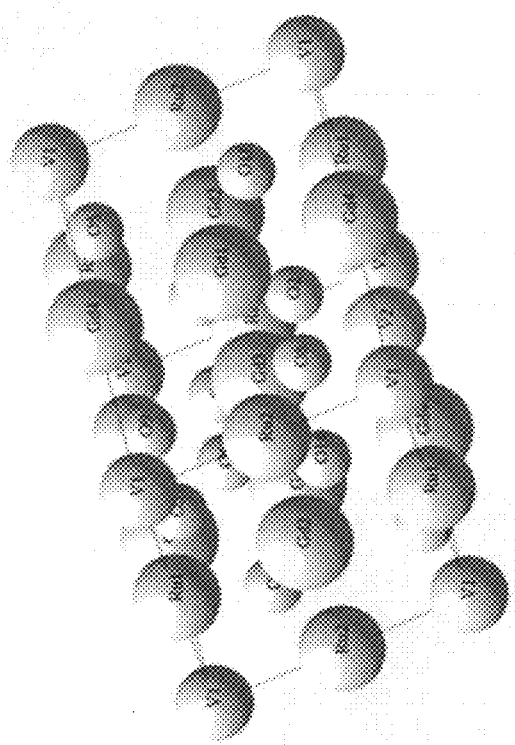
FIG. 8 is a diagram illustrating a complex oxide, according to an embodiment of the present invention.
Figure 10:
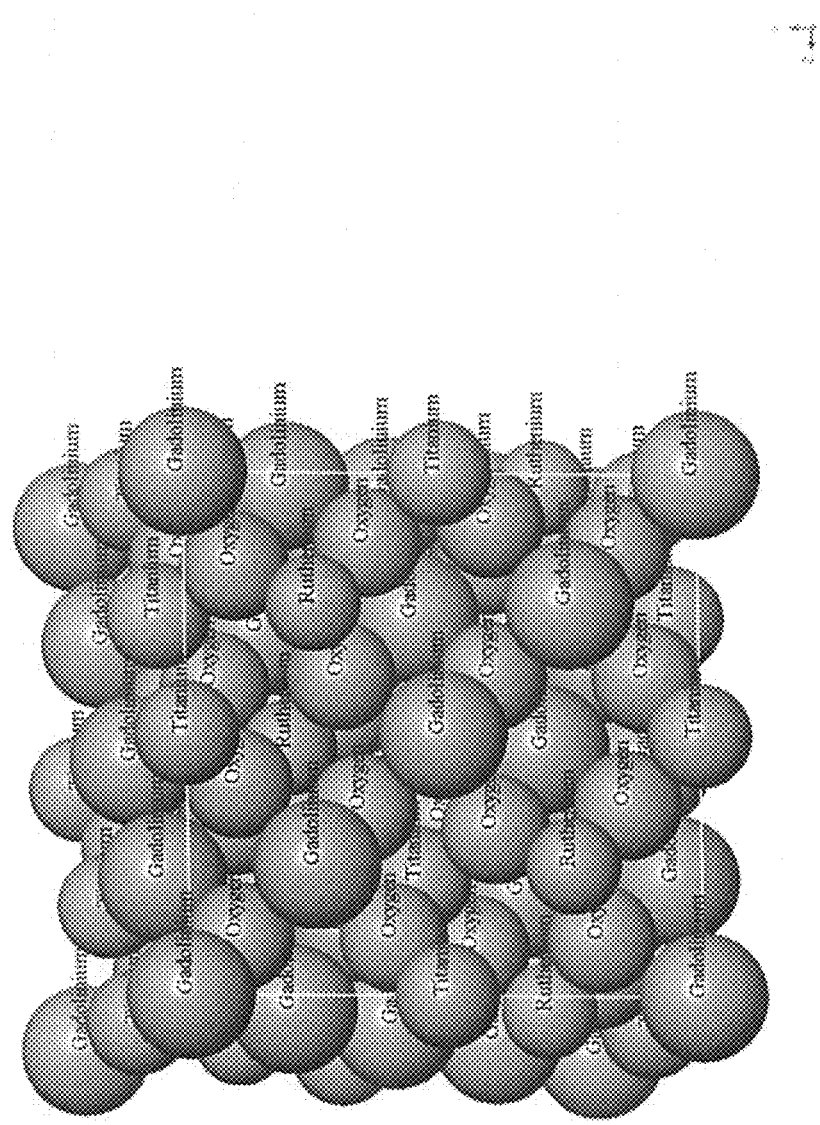
FIG. 10 is a depiction of the relative spatial arrangements of atoms in the cubic form of ($Gd_2RuTiO_7$).
Figure 11:
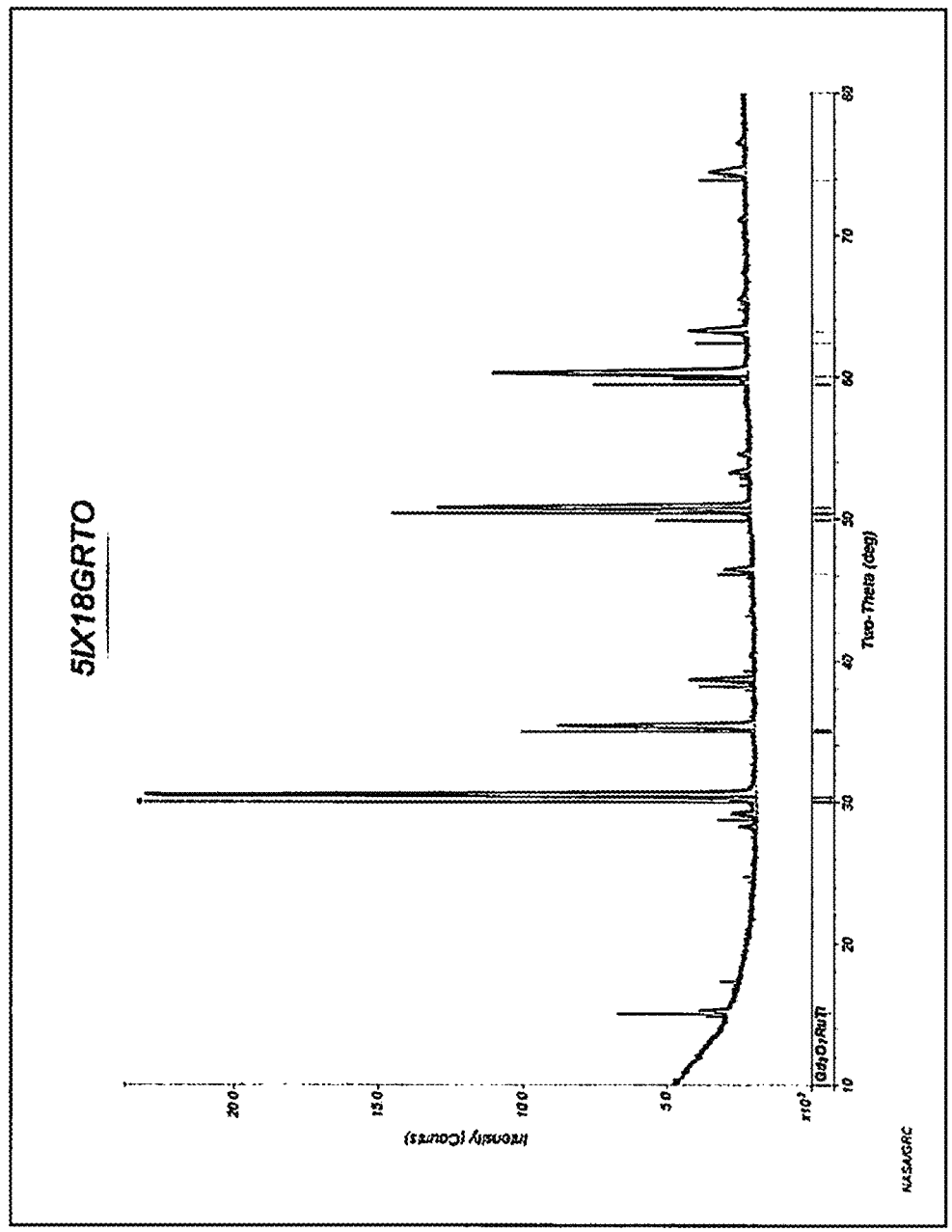
FIG. 11 shows the crystal structure is validated with the comparison of predicted X-ray diffraction pattern (thick, blue) with actual diffraction pattern (thin, black) of ($Gd_2RuTiO_7$).

FIG. 8 is a diagram illustrating a complex oxide 800, according to an embodiment of the present invention. In this embodiment, complex oxide 800 is gadolinium ruthenium vanadium oxide ($Gd_2RuVO_7$). It should be noted that vanadium is generally a lower temperature chemical. Also, the ruthenium aspect gives the conduction aspect. Complex oxide 800, as shown in FIG. 8, depicts equilibrium alternative predicted crystal structure for the gadolinium ruthenium vanadium oxide ($Gd_2RuVO_7$) and ($Gd_2RuTaO_7$) as shown in FIG. 10 with reference to the predicted X-ray diffraction pattern versus the actual diffraction pattern compound shown in FIG. 11.

Figure 9:
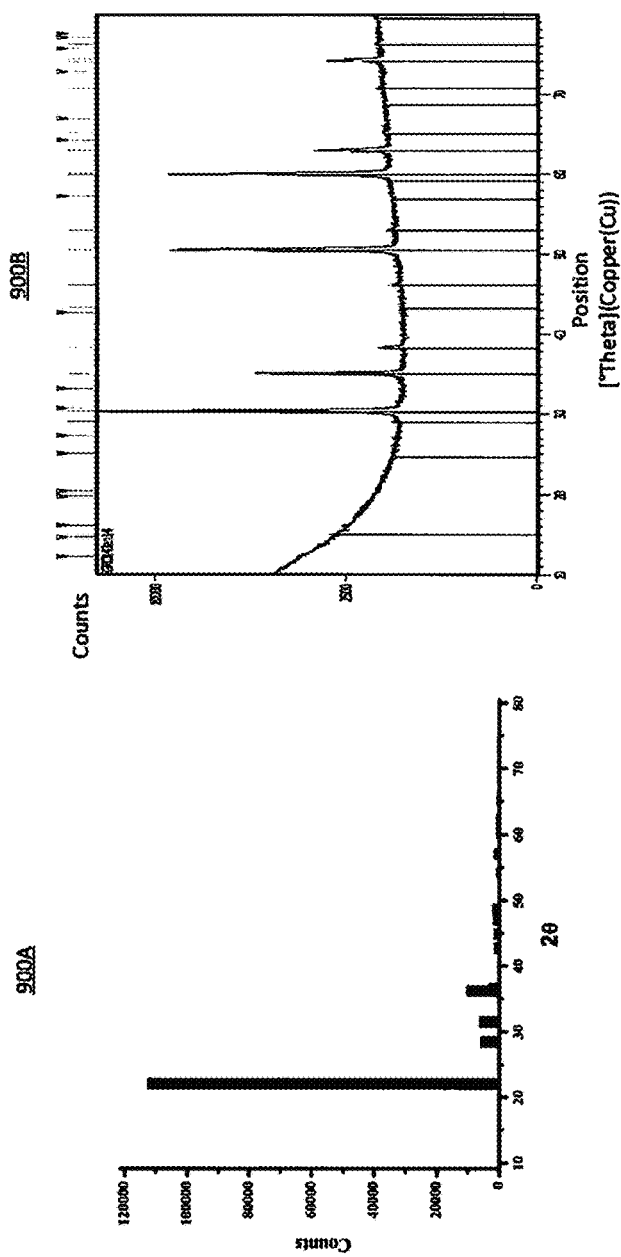
FIG. 9 are graphs illustrating experimental Seebeck coefficient and resistivity data for the complex oxide of FIG. 8, according to an embodiment of the present invention.

FIG. 9 are graphs 9000A, 9000B illustrating experimental Seebeck coefficient and resistivity data for the complex oxide of FIG. 8, according to an embodiment of the present invention. In this example, the following chemical formula $2Gd_2(CO_3)_3+\frac{1}{2}V_2O_5+2RuO_2$ was used. This chemical formula, when mixed and heated, resulted in $2Gd_2RuVO_7+6CO_2+\frac{1}{2}O_2$. As shown in graph 9000A, a predicted x-ray diffraction pattern is shown for gadolinium ruthenium vanadium oxide ($Gd_2RuVO_7$).

As shown in graph 900B, actual x-ray diffraction pattern resulted from synthesis attempt is shown identifying desired product partial formed.

Some embodiments generally pertain to a complex oxide based pyrochlores having a chemical formula of A2 B2 O7 configured to directly convert heat into electricity and operate and function at a higher temperature without oxidizing in air. The complex oxide based pyrochlores are mixed with cation at B-site, with the B-site comprising $B^{3+}$, $B^{-5+}$. This may allow for the complex oxide based pyrochlores to be used in a gas turbine engine.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus for solid state energy harvesting, comprising:
   a complex oxide based pyrochlores having a chemical formula of A2 B2 O7 configured to directly convert heat into electricity and operate and function at a higher temperature without oxidizing in air, wherein
   A2 represents 2 atoms of gadolinium and B2 represents 1 atom of ruthenium and 1 atom of vanadium, and
   the complex oxide based pyrochlores are mixed with cation at B-site.

2. The apparatus of claim 1, wherein the B-site comprises $B^{3+}$ and $B^{-5+}$, allowing the complex oxide based pyrochlores to be used in a gas turbine engine.

3. The apparatus of claim 1, wherein the complex oxide based pyrochlores range from insulating to semi-conducting material.

4. The apparatus of claim 3, wherein the complex oxide based pyrochlores has semiconducting behavior with a fraction of an electron volt to facilitate electric power conversion.

5. The apparatus of claim 1, wherein the complex oxide based pyrochlores comprise a Seebeck coefficient at approximately 100 micro-volt per degree temperature Kelvin.

6. The apparatus of claim 1, wherein the complex oxide based pyrochlores comprise an electrical resistivity of approximately $10^{-2}$ Ohm*cm.

7. The apparatus of claim 1, wherein the complex oxide based pyrochlores comprise a thermal conductivity of approximately 10 W/m*K.

8. The apparatus of claim 1, wherein the complex oxide based pyrochlores comprise an electronic band gap greater than zero without oxidizing at high temperatures of 500 to 800 K in the air.

9. An apparatus for solid state energy harvesting, comprising:
   a complex oxide based pyrochlores having a chemical formula of A2 B2 O7 configured to directly convert heat into electricity and operate and function at a higher temperature without oxidizing in air, wherein
   A2 represents 2 atoms of gadolinium and B2 represents 1 atom of ruthenium and 1 atom of vanadium, and
   the complex oxide based pyrochlores are mixed with cation at B-site, the B-site comprising $B^{3+}$ and $B^{-5+}$, allowing the complex oxide based pyrochlores to be used in a gas turbine engine.

10. The apparatus of claim 9, wherein the complex oxide based pyrochlores range from insulating to semi-conducting material.

11. The apparatus of claim 10, wherein the complex oxide based pyrochlores has semiconducting behavior with a fraction of an electron volt to facilitate electric power conversion.

12. The apparatus of claim 9, wherein the complex oxide based pyrochlores comprise a Seebeck coefficient at approximately 100 micro-volt per degree temperature Kelvin.

13. The apparatus of claim 9, wherein the complex oxide based pyrochlores comprise an electrical resistivity of approximately $10^{-2}$ Ohm*cm.

14. The apparatus of claim 9, wherein the complex oxide based pyrochlores comprise a thermal conductivity of approximately 10 W/m*K.

15. The apparatus of claim 9, wherein the complex oxide based pyrochlores comprise an electronic band gap greater than zero without oxidizing at high temperatures of 500 to 800 K in the air.

16. The apparatus of claim 9, wherein the complex oxide based pyrochlores comprises a predictive property of calculated cell parameters having a density of 8.75 mg/cm$^3$.

* * * * *